US009412713B2

(12) United States Patent
Buckalew et al.

(10) Patent No.: US 9,412,713 B2
(45) Date of Patent: Aug. 9, 2016

(54) TREATMENT METHOD OF ELECTRODEPOSITED COPPER FOR WAFER-LEVEL-PACKAGING PROCESS FLOW

(71) Applicant: Novellus Systems, Inc., Fremont, CA (US)

(72) Inventors: Bryan L. Buckalew, Tualatin, OR (US); Steven T Mayer, Lake Oswego, OR (US); Thomas Ponnuswamy, Sherwood, OR (US); David Porter, Sherwood, OR (US)

(73) Assignee: Novellus Systems, Inc., Fremont, CA (US)

( * ) Notice: Subject to any disclaimer, the term of this patent is extended or adjusted under 35 U.S.C. 154(b) by 704 days.

(21) Appl. No.: 13/744,335

(22) Filed: Jan. 17, 2013

(65) Prior Publication Data

US 2014/0197037 A1 Jul. 17, 2014

(51) Int. Cl.
*H05H 3/00* (2006.01)
*H01L 23/00* (2006.01)
(Continued)

(52) U.S. Cl.
CPC ........ *H01L 24/11* (2013.01); *C25D 3/38* (2013.01); *C25D 5/10* (2013.01); *C25D 5/50* (2013.01); *H01L 21/6723* (2013.01); *H01L 24/03* (2013.01); *C25D 3/60* (2013.01); *C25D 17/00* (2013.01); *H01L 21/2885* (2013.01); *H01L 24/05* (2013.01); *H01L 24/13* (2013.01);
(Continued)

(58) Field of Classification Search
CPC ...... H01L 24/11; H01L 21/6723; H01L 24/03; H01L 21/2885; H01L 24/05; H01L 24/13; H01L 2224/03462; H01L 2224/03848; H01L 2224/0401; H01L 2224/05548; H01L 2224/05647; H01L 2224/11334; H01L 2224/119; H01L 24/12; H01L 2224/03912; H01L 2224/13099; H01L 2224/131; H01L 2924/01004; H01L 2924/01005; H01L 2924/01006; H01L 2924/01007; H01L 2924/01014; H01L 2924/01022; H01L 2924/01027; C25D 3/38; C25D 5/10; C25D 5/50; C25D 3/60; C25D 17/00
See application file for complete search history.

(56) References Cited

U.S. PATENT DOCUMENTS 6,793,796 B2 9/2004 Reid et al.
2005/0224966 A1* 10/2005 Fogel et al. .................. 257/737

OTHER PUBLICATIONS

U. S. Application titled, "Electroplating Apparatus and Process for Wafer Level Packaging," U.S. Appl. No. 13/305,384, filed Nov. 28, 2011. [NOVLP368].

(Continued)

*Primary Examiner* — Xiuyu Tai
(74) *Attorney, Agent, or Firm* — Weaver Austin Villeneuve & Sampson, LLP

(57) ABSTRACT

A method of treating a copper containing structure on a substrate is disclosed. The method includes electrodepositing the copper containing structure on a substrate, annealing the copper containing structure, and forming an interface between a pad of the copper containing structure and a solder structure after anneal. The interface can have improved resistance to interfacial voiding. The copper containing structure is configured to deliver current between one or more ports and one or more solder structures in the integrated circuit package. Annealing the copper containing structure can move impurities and vacancies to the surface of the copper containing structure for subsequent removal.

19 Claims, 10 Drawing Sheets

(51) Int. Cl.
*H01L 21/67* (2006.01)
*C25D 3/38* (2006.01)
*C25D 5/10* (2006.01)
*C25D 5/50* (2006.01)
*H01L 21/288* (2006.01)
*C25D 3/60* (2006.01)
*C25D 17/00* (2006.01)

(52) U.S. Cl.
CPC ........... *H01L 2224/03462* (2013.01); *H01L 2224/03848* (2013.01); *H01L 2224/0401* (2013.01); *H01L 2224/05548* (2013.01); *H01L 2224/05647* (2013.01); *H01L 2224/11334* (2013.01); *H01L2224/11849* (2013.01); *H01L 2224/13111* (2013.01); *H01L 2224/16503* (2013.01); *H01L 2224/94* (2013.01); *H01L 2924/01322* (2013.01); *H01L 2924/12044* (2013.01); *H01L 2924/3656* (2013.01)

(56) References Cited

OTHER PUBLICATIONS

Kim, et al., "Effects of Residual Impurities in Electroplated Cu on the Kirkendall Void Formation During Soldering," *Applied Physics Letter*, 92, 092109, 2008, pp. 092109-1-092109-3.

Kim, et al., "Recrystallization-Induced Void Migration in Electroplated Cu Films," *SciVerse ScienceDirect*, Scripta Materialia, 67, 2012, pp. 312-315.

* cited by examiner

TREATMENT METHOD OF ELECTRODEPOSITED COPPER FOR WAFER-LEVEL-PACKAGING PROCESS FLOW

INTRODUCTION

1. Field of the Invention

This disclosure generally relates to wafer level packaging for integrated circuit packages. Certain aspects of this disclosure pertain to treatment of electrodeposited copper-containing structures in wafer level packaging.

2. Background

Integrated circuit (IC) chips or dies are typically interfaced with other circuits using a package that can be connected to, e.g., a printed circuit board (PCB). In some cases, IC packaging includes wafer level packaging (WLP), which is an electrical connection technology that employs relatively large features, typically on the scale of micrometers. Examples of WLP structures include redistribution wiring, bumps, and pillars.

The packaging standard may be specified industry-wide or specific to a particular company or group of companies. For example, an IC die package can be packaged as an industry standard ball grid array (BGA) package. A BGA package has an array of solder ball pads positioned on a bottom surface of a substrate, where solder balls contact the pads/ports of a PCB and the solder balls are reflowed to attach to the package of a PCB. In such an implementation of a BGA package, wire bonds are connected between pads/ports of the die and electrical features of the substrate.

Attaching solder balls or bumps to the pads of the IC dies in WLP can be challenging. In some cases, the I/O ports of an IC die package may be too close together to have solder bumps formed directly on them. As a result, redistribution layers (RDLs) may be formed on the IC die to provide redistributed access to the I/O ports. An RDL is a type of routing that includes a plurality of electrically conductive routing lines and RDL contacts embedded in a dielectric material for carrying electrical signals. An RDL can be formed on an IC die between an I/O port and another region of the IC die at which an electrical connection, such as a solder bump, can be formed. Thus, RDLs can redistribute positions of I/O ports in an IC die corresponding to a format of a particular packaging standard. The redistribution lines may include the horizontal and vertical line components between the chip I/Os and the package I/O ports. The redistribution lines may terminate in pads, which can be flat and elevated, upon which a solder structure is affixed.

Other routing formats may include pillars for connecting chip I/Os to package I/O ports. Such pillars typically have only vertical line components.

An interface can form between the pad and the solder structure affixed upon the pad. An intermetallic compound (IMC) may form on the pad-solder interface upon reflow. Microscopic interfacial voids may form in the interface of the IMC, which may sometimes be referred to as "Kirkendall" voids. Such voids can seriously degrade the mechanical and electrical reliability of the IC device. High levels of interfacial voiding can form in solder interfaces with electrodeposited copper.

SUMMARY OF THE INVENTION

This disclosure pertains to methods of improving the quality of an interface between a copper pad on an integrated circuit or a package and a solder region provided on the copper pad. In certain embodiments, the method involves thermally treating electroplated copper containing the pad to promote (1) removal of impurities from electroplated copper, and (2) optionally form voids or nucleate vacancies on the surface of the copper, prior to forming an interface between the copper pad with the solder material. The interface between the pad and the solder region has improved resistance to interfacial voiding at the interface.

In some embodiments, the copper pad is part of a copper redistribution layer in the integrated circuit. The solder region may contain an electroplated solder material or may include a solder ball. When electrodepositing the copper structure for the copper pad, an electroplating solution may be used containing additives, such as accelerators, suppressors, and levelers. Electrodepositing the copper structure can be performed at a rate that is at least 25% of the limiting current for electrodepositing copper. The copper pad and the solder region may be substantially free of any nickel, cobalt, and gold. Annealing the copper structure can be performed at a temperature between about 100° C. and about 400° C.

This disclosure also pertains to apparatus such as systems or platforms containing plating modules, anneal modules, and optionally other modules associated with the complete RDL process. Examples of such other modules include modules for photoresist stripping, etching, solder plating, etc. The apparatus is configured to remove impurities and/or form voids/vacancies on a copper pad prior to forming an interface with solder. In some embodiments, the apparatus can include a controller with instructions for annealing the copper pad in the anneal module. The instructions for annealing the copper pad provide an interface between the copper pad and the solder that has improved resistance to interfacial voiding.

In some embodiments, the controller can also include instructions for mechanically contacting the solder with the pad after annealing the copper pad. In some embodiments, the controller can also include instructions for electrodepositing solder material on the pad after annealing the copper pad. In some embodiments, the controller can also include instructions for electrodepositing the copper pad using an electroplating solution containing additives, such as accelerators, suppressors, and levelers. The electrodeposition of the copper pad can be performed at a rate that is greater than about 1 µm per minute in a direction away from the substrate.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.
Introduction Although the present disclosure may be used in a variety of applications, one very useful application is in wafer level packaging (WLP) commonly used in the manufacture of semiconductor packages. WLP applications may include metal interconnects, including routing layers such as copper redistribution layers (RDLs). A solder structure may form a solder interface with such metal interconnects.

Figure 1A:
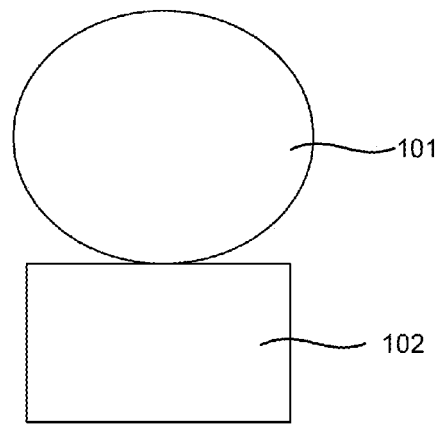
FIG. 1A shows an example of a cross-sectional schematic of a solder structure over a copper containing structure.
Figure 1B:
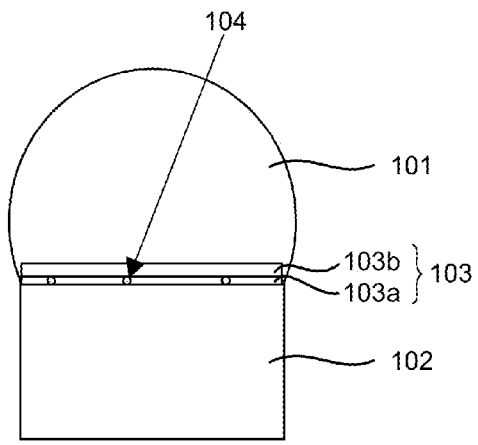
FIG. 1B shows an example of a cross-sectional schematic of the solder structure over the copper containing structure from FIG. 1A after reflow.
Figure 1C:
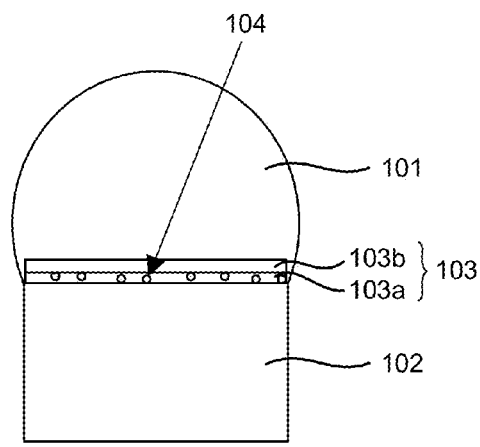
FIG. 1C shows an example of a cross-sectional schematic of the solder structure over the copper containing structure from FIG. 1B after aging.

Interfacial voiding may form in the interface between the solder structure and the metal interconnect. FIGS. 1A-1C illustrate various stages of contacting, reflowing, and aging a copper containing structure with a solder structure, and the corresponding nucleation of interfacial voids at each of the stages. The interfacial voids that form in the interface between the solder structure and the copper containing structure can seriously degrade a solder joint and lead to mechanical and electrical failure in an IC device.

FIG. 1A shows an example of a cross-sectional schematic of a solder structure over a copper containing structure. The solder structure 101 can be positioned over and in contact with a copper containing structure 102. As illustrated in the example in FIG. 1A, the solder structure 101 can be a solder ball, such as a tin-silver-copper ("SAC") solder ball. The copper containing structure 102 can include electroplated copper that forms part of a contact pad for a copper RDL.

FIG. 1B shows example of a cross-sectional schematic of the solder structure over the copper containing structure from FIG. 1A after reflow. The solder structure 101 can be melted and reflowed to form an interface 103 with the copper containing structure 102. The interface 103 can provide a solder joint for an electrical connection in an IC package. In forming the interface 103, metallurgical reactions can lead to the formation of a layered intermetallic compound (IMC). In some embodiments, the intermetallic compound can include eutectic compositions of tin (Sn) and copper (Cu), which can include bronzes of different stoichiometric ratios. Copper atoms diffuse into the solder structure 101 that can contain an alloy of tin. A copper-rich phase forms a $Cu_3Sn$ layer 103a near the copper containing structure 102, and a tin-rich phase forms a $Cu_6Sn_5$ layer 103b near the solder structure 101. The $Cu_3Sn$ layer 103a can be a relatively thin layer having a thickness between about 40 nm and about 50 nm, and the $Cu_6Sn_5$ layer 103b can be a relatively thick layer having a thickness between about 0.5 μm and about 2.0 μm.

Interfacial voids 104, sometimes referred to as "Kirkendall" voids, can form in the interface 103, particularly in the copper-rich $Cu_3Sn$ layer 103a. Kirkendall void formation can be attributed to the vacancy flux caused by the difference in intrinsic diffusivities between two species in a binary system (e.g., Cu and Sn). Vacancy fluxes arise in reactive inter-diffusion systems where reaction product formation between the two diffusion species is accompanied by divergence of vacancy fluxes. In the example in FIG. 1B, a small number of interfacial voids 104 can form upon reflow. However, an increased number of interfacial voids can form over time.

Figure 2:
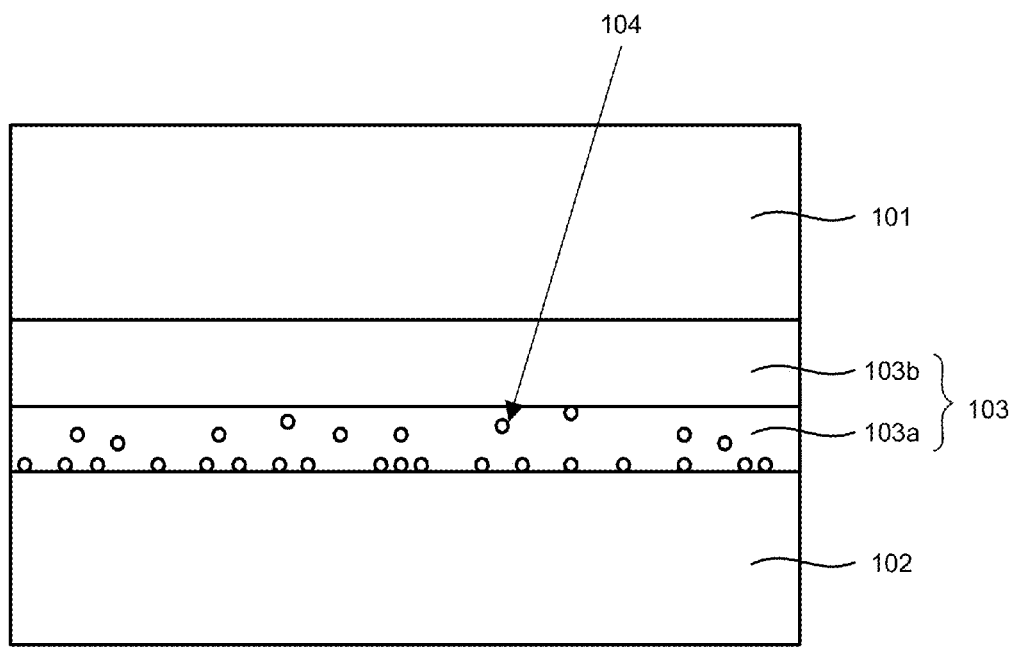
FIG. 2 shows an example of an exploded view of the solder structure over the copper containing structure from FIG. 1C.

FIG. 1C shows an example of a cross-section schematic of the solder structure over the copper containing structure from FIG. 1B after aging. FIG. 2 shows an example of an exploded view of the solder structure over the copper containing structure from FIG. 1C. After aging, the number of interfacial voids 104 can increase in the interface 103. Thus, over time the nucleation of interfacial voids 104 can grow substantially. As illustrated in the example in FIG. 1C, the interfacial voids 104 tend to localize in the $Cu_3Sn$ layer 103a, which can impede the migration of copper atoms. The interfacial voids 104 can also result in mechanical failure of the solder joint. The increased concentration of interfacial voids 104 can lead to device failure.

Figure 3A:
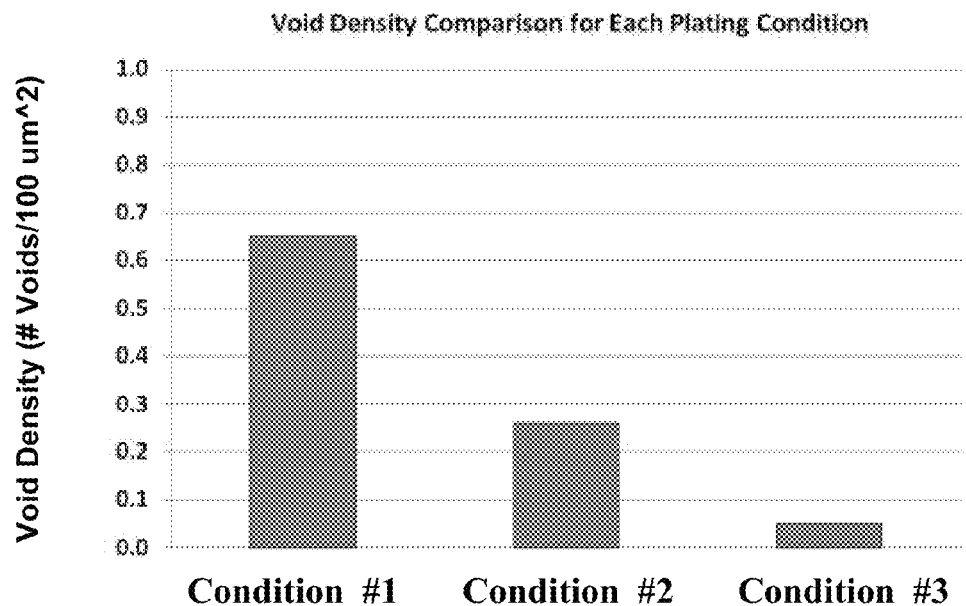
FIG. 3A shows a graph of void density at a solder interface for each of the samples under three different electroplating conditions.
Figure 3B:
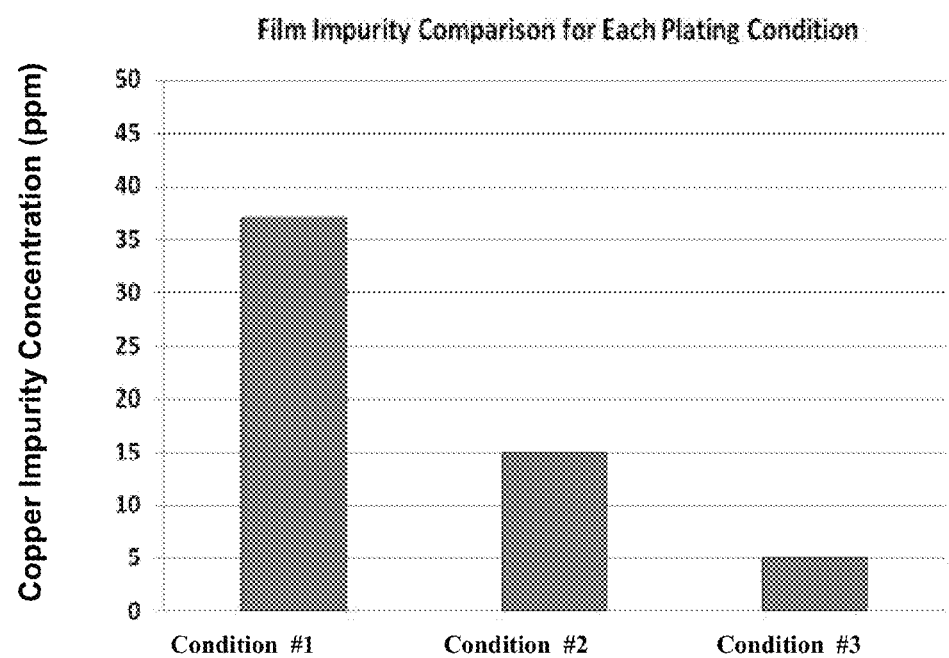
FIG. 3B shows a graph of copper impurity concentration at a solder interface for each of the samples under the electroplating conditions in FIG. 3A.

Copper RDL samples were tested under various electroplating conditions to examine the correlation between impurity concentration and interfacial void formation. FIGS. 3A-3B provide data relating void density and impurity concentration under three different electroplating conditions, and FIG. 3C graphically illustrates the correlation between void density and impurity concentration.

Table 1 shows the three electroplating conditions under which the copper RDL samples were formed. Condition 1 shows a relatively high concentration of additives, e.g., levelers, a relatively high mass transfer rate, and a relatively low electroplating bath temperature. Condition 2 shows a relatively low concentration of additive, a relatively high mass transfer rate, and a relatively low electroplating bath temperature. Condition 3 shows a relatively low concentration of additive, a relatively low mass transfer rate, and a relatively high electroplating bath temperature. Levelers are a type of additive that are added to the electroplating solution and improve the electroplating reaction. Mass transfer rates describe the rate at which metal ions move near the surface of a substrate.

TABLE 1

| Condition | Normalized Leveler Concentration | Normalized Mass Transfer Rate | Bath Temperature (° C.) |
|---|---|---|---|
| 1 | 1.0 | 1.0 | 25 |
| 2 | 0.7 | 1.0 | 25 |
| 3 | 0.7 | 0.5 | 30 |

Each of the electroplated copper RDL samples underwent photoresist strip followed by seed and barrier etch. A SAC solder ball contacted each electroplated copper RDL pad and was then reflowed. Each copper RDL sample was thermally aged at 175° C. for about 150 hours. The interfacial void density was measured for each sample by focused ion beam (FIB) scanning electron microscopy (SEM) analysis. The concentration of impurities in the plated copper was analyzed by secondary ion mass spectrometry (SIMS) for Cu, oxygen (O), sulfur (S), chlorine (Cl), and carbon (C).

FIG. 3A shows a graph of void density at a solder interface for each of the samples under the three different electroplating conditions. Condition 1 resulted in significant void density at about 0.65 voids/100 µm$^2$, condition 2 resulted in moderate void density at about 0.26 voids/100 µm$^2$, and condition 3 resulted in minimal void density at about 0.05 voids/100 µm$^2$.

FIG. 3B shows a graph of copper impurity concentration at a solder interface for each of the samples under the electroplating conditions in FIG. 3A. The copper impurity concentration was measured in terms of the combined concentration S, Cl, and C in parts per million (ppm). Condition 1 resulted in the highest impurity concentration at about 37 ppm, condition 2 resulted in a moderate impurity concentration at about 15 ppm, and condition 3 resulted in a relatively low impurity concentration at about 5 ppm.

Figure 3C:
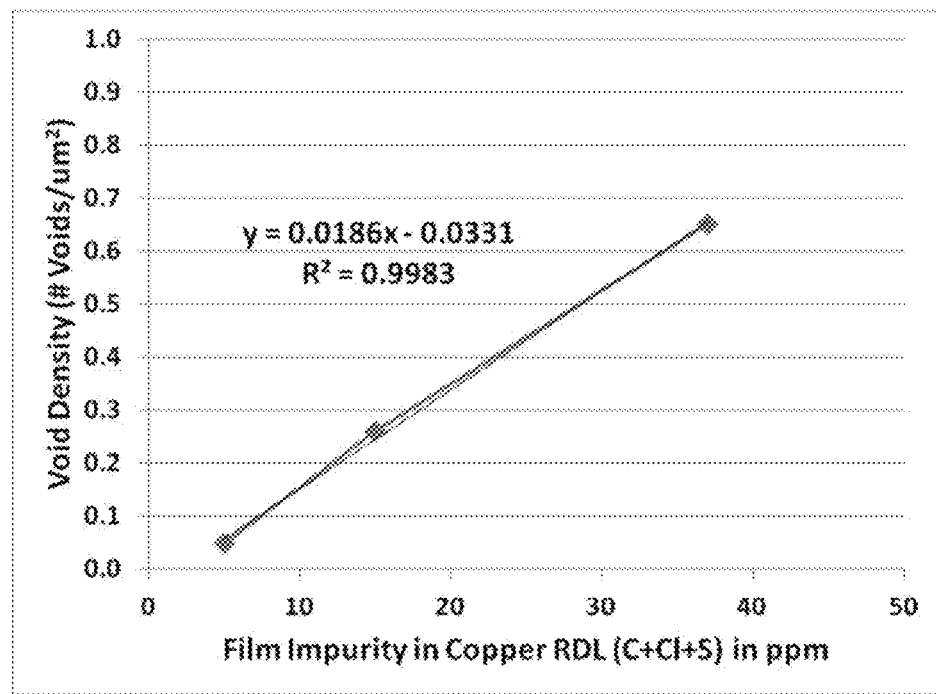
FIG. 3C shows a graph illustrating the correlation between void density and copper impurity concentration from FIGS. 3A and 3B.

FIG. 3C shows a graph illustrating the correlation between void density and copper impurity concentration from FIGS. 3A and 3B. The graph establishes a strong correlation between impurity concentration and void density. In other words, the conditions with the highest impurity concentration resulted in the highest void density, while the conditions with the lowest impurity concentration resulted in the lowest void density. Without being limited by any theory, the impurities may induce void nucleation and subsequent growth during thermal aging by several means. The impurities may induce void nucleation by high level vacancy supersaturation. The high level vacancy supersaturation may result from vacancy sinks being blocked by impurities, or impurities may promote heterogeneous nucleation of voids by changing the interfacial energies at locations such as grain boundaries that reduces the activation energy required for nucleation. Regardless, the data suggests that copper impurities can lead to interfacial voiding.

Process

A method of treating a copper containing structure on a substrate is disclosed. The substrate can be part of a semiconductor package, such as an integrated circuit (IC). The method includes electrodepositing the copper containing structure on a substrate, annealing the copper containing structure, and forming an interface between a pad of the copper containing structure and a solder structure after anneal. The interface can have improved resistance to interfacial voiding. Put another way, there is less voiding at the interface after annealing the copper containing structure than without annealing the copper containing structure, thereby improving the interface integrity between the copper containing structure and the solder structure.

Figure 4:
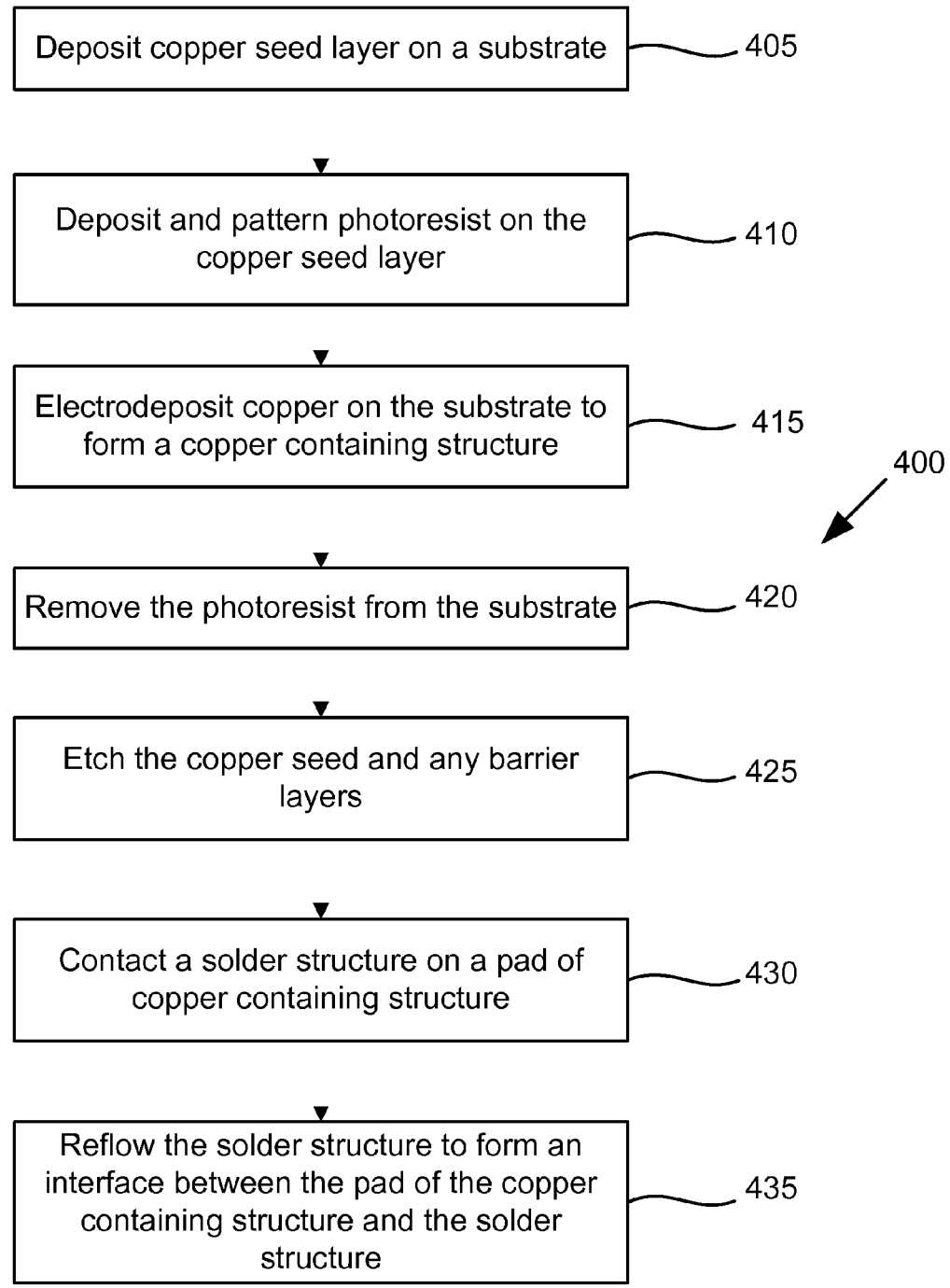
FIG. 4 shows an exemplary flowchart of a method of forming a solder interface with a pad of a copper containing structure.

FIG. 4 shows an exemplary flowchart of a method of forming a solder interface. The process 400 illustrates a typical process flow for soldering a solder structure, such as a solder ball, with a copper containing structure, such as a copper RDL pad, copper pillar, or other similar structure. The copper containing structure may be configured to deliver current between one or more ports and one or more solder structures in an integrated circuit package. The thickness of the copper containing structure can be greater than about 1 µm, such as between about 5 µm and about 10 µm. The thickness is typically the distance between the substrate on which copper is plated and the surface of the plated copper which interfaces with the solder.

The copper containing structure may include only copper or copper alloy. The copper containing structure may substantially include copper, which can include at least 90 weight percent of copper. In some embodiments, the copper containing structure can include at least 99 weight percent of copper. In some embodiments, one or more alloying elements may be included in the copper containing structure. For example, the copper containing structure may include about 0.1 to 5 weight percent of an alloying element or elements.

Typically, though not necessarily, in forming the interface between the copper containing structure and the solder structure, there is no layer that contains an element other than copper or the materials comprising the solder structure. For example, there is no layer of nickel, cobalt, or gold disposed between the copper containing structure and the solder structure to prevent the formation of IMCs. Thus, in certain embodiments, the copper containing structure is substantially free of nickel, cobalt, and gold.

The process 400 begins at step 405, where a copper seed layer is deposited on a substrate. Deposition of the copper seed layer in step 405 may occur by physical vapor deposition (PVD). In some embodiments, the copper seed layer may be deposited on a barrier layer, such as tantalum (Ta), tantalum nitride (TaN), or a TaN/Ta bi-layer.

The process 400 continues at step 410, where photoresist is deposited and patterned on the copper seed layer. In some embodiments, the photoresist is deposited by any suitable technique, such as spin coating, and then patterned according to a desired copper RDL layout. For example, the photoresist can be patterned by selectively masking, exposing, developing, and etching the photoresist. Patterning may remove some or all of the barrier layer, if present, at ports on the substrate such as I/O ports on an integrated circuit.

The process 400 continues at step 415, where copper is electrodeposited on the substrate to form the copper containing structure. In some embodiments, the copper can be plated on the substrate electrolytically by immersing the substrate in an electroplating bath and applying cathodic current to substrate. The electroplating bath can contain positive ions of copper and associated anions in an acid solution. The source of copper ions may be copper sulfate ($CuSO_4$), copper methane sulfonate ($Cu(CH_3SO_3)_2$), copper gluconate ($C_{12}H_{22}CuO_{14}$), copper sulfamate, copper nitrate, copper phosphate, copper chloride and others. The electroplating bath can contain between about 10 g/L and about 150 g/L of sulfuric acid, and between about 10 g/L and about 70 g/L of copper ions. For example, the electroplating bath can include about 140 g/L of sulfuric acid and about 40 g/L of copper ions. Step 415 of FIG. 4 may involve a series of electrofilling processes that is described in U.S. Pat. No. 6,793,796, filed Feb. 28, 2001, the entirety of which is hereby incorporated by reference. The description recites at least four phases of the electrofilling process and discloses controlled current density methods for each phase for optimal filling of relatively small recessed features.

In some embodiments, besides copper ions and associated anions in acidic solution, the electroplating bath may also contain additives. Such additives may include accelerators, suppressors, and levelers to improve electroplating behavior by, among other things, enhancing chemical reactions, improving surface deposition, improving thickness uniformity, and enhancing filling of high aspect ratio features. Sulfuric acid provides high conductivity to the electrolyte. In some embodiments, chloride or other halide ions are provided to enhance additive performance.

As the name implies, accelerators are additives that increase the rate of a plating reaction. Accelerators are molecules, such as catalysts, that adsorb onto metal surfaces and increase the local current density at a given applied voltage.

Accelerators are typically relatively small molecules (e.g., about 300 MW) that normally contain sulfur, and they need not be ionic. The net effect of accelerators is to increase current flow and accelerate the plating reaction.

While not wishing to be bound by any theory or mechanism of action, it is believed that accelerators (either alone or in combination with other bath additives) tend to locally reduce the polarization effect associated with the presence of suppressors, and thereby locally increase the electrodeposition rate. The reduced polarization effect is most pronounced in regions where the adsorbed accelerator is most concentrated (i.e., the polarization is reduced as a function of the local surface concentration of adsorbed accelerator). Example accelerators include, but are not limited to, dimercaptopropane sulfonic acid, dimercaptoethane sulfonic acid, mercaptopropane sulfonic acid, mercaptoethane sulfonic acid, and their derivatives. Although the accelerator may become strongly adsorbed to the substrate surface, the accelerator is generally not incorporated into the film. Thus, the accelerator remains on the surface as metal is deposited. As a recess is filled, the local accelerator concentration increases on the surface within the recess. Accelerators tend to be smaller molecules and exhibit faster diffusion into recessed features, as compared to suppressors.

A suppressor is used to decrease the current density, and thus the deposition rate on the surface of a substrate at a given applied voltage. The effect is most pronounced in the field regions and upper portions of recesses. This allows differentiation in deposition rate between the substrate surface and the inside of high aspect ratio features, thereby enhancing void-free fill of high aspect ratio features. Typical suppressors are relatively large molecules (e.g., between about 2,000 and 6,000 MW). They increase the surface polarization layer and prevent copper ion from readily adsorbing onto the surface. Thus, suppressors function as blockers. Suppressors cause the resistance of the surface to be very high in relation to the electroplating bath. Trace levels of chloride or other ion may be required for suppressors to be effective.

While not wishing to be bound to any theory or mechanism of action, it is believed that suppressors (either alone or in combination with other bath additives) are surface-kinetic polarizing compounds that lead to a significant increase in the voltage drop across the substrate interface, especially when present in combination with a surface chemisorbing halide (e.g., chloride or bromide). The suppressor both (1) increases the local polarization of the substrate surface at regions where the suppressor is present relative to regions where the suppressor is absent, and (2) increases the polarization of the substrate surface generally. The increased polarization (local and/or general) corresponds to increased resistivity/impedance and therefore slower plating at a particular applied potential.

It is believed that suppressors are not incorporated into the deposited film, though they may slowly degrade over time. Suppressors are often relatively large molecules, and in many instances they are polymeric in nature (e.g., polyethylene oxide, polypropylene oxide, polyethylene glycol, polypropylene glycol, etc.). Due in part to suppressors' large size, the diffusion of these compounds into a recessed feature is relatively slow.

A leveler may be added to improve overall deposit planarity and to increase the ease of subsequent chemical mechanical planarization (CMP) processing. Levelers behave like suppressors, but tend to be more electrochemically active (i.e., are more easily electrochemically transformed) than suppressors. Levelers are typically consumed during electroplating. Levelers tend to suppress plating on raised regions of the surface undergoing plating, thus tending to level the plated surface.

While not wishing to be bound by any theory or mechanism of action, it is believed that levelers (either alone or in combination with other bath additives) act as suppressing agents to counteract the depolarization effect associated with accelerators, especially in the field region and at the sidewalls of a feature. The leveler may locally increase the polarization/surface resistance of the substrate, thereby slowing the local electrodeposition reaction in regions where the leveler is present. The local concentration of levelers is determined to some degree by mass transport. Therefore levelers act principally on surface structures having geometries that protrude away from the surface. This action "smooths" the surface of the electrodeposited layer. It is believed that leveler reacts or is consumed at the substrate surface at a rate that is at or near a diffusion limited rate, and therefore, a continuous supply of leveler is often beneficial in maintaining uniform plating conditions over time.

Leveler compounds are generally classified as levelers based on their electrochemical function and impact and do not require specific chemical structure or formulation. However, levelers often contain one or more nitrogen, amine, imide or imidazole, and may also contain sulfur functional groups. Certain levelers include one or more five and six member rings and/or conjugated organic compound derivatives. Nitrogen groups may form part of the ring structure. In amine-containing levelers, the amines may be primary, secondary or tertiary alkyl amines. Furthermore, the amine may be an aryl amine or a heterocyclic amine. Example amines include, but are not limited to, dialkylamines, trialkylamines, arylalkylamines, triazoles, imidazole, triazole, tetrazole, benzimidazole, benzotriazole, piperidine, morpholines, piperazine, pyridine, oxazole, benzoxazole, pyrimidine, quonoline, and isoquinoline. Imidazole and pyridine may be especially useful. Leveler compounds may also include ethoxide groups. For example, the leveler may include a general backbone similar to that found in polyethylene glycol or polyethyelene oxide, with fragments of amine functionally inserted over the chain (e.g., Janus Green B). Example epoxides include, but are not limited to, epihalohydrins such as epichlorohydrin and epibromohydrin, and polyepoxide compounds. Polyepoxide compounds having two or more epoxide moieties joined together by an ether-containing linkage may be especially useful. Some leveler compounds are polymeric, while others are not. Example polymeric leveler compounds include, but are not limited to, polyethylenimine, polyamidoamines, and reaction products of an amine with various oxygen epoxides or sulfides. One example of a non-polymeric leveler is 6-mercapto-hexanol.

In a bottom-up fill mechanism, a recessed feature on a plating surface tends to be plated with metal from the bottom to the top of the feature, and inward from the sidewalls towards the center of the feature. It is important to control the deposition rate within the feature and in the field region in order to achieve uniform filling and avoid incorporating voids into the features. The three types of additives described above are beneficial in accomplishing bottom-up fill, each working to selectively increase or decrease the polarization at the substrate surface.

After the substrate is immersed in electrolyte, the suppressor adsorbs onto the surface of the substrate, especially in exposed regions such as the field region. At the initial plating stages, there is a substantial differential in suppressor concentration between the top and bottom of a recessed feature. This differential is present due to the relatively large size of the suppressor molecule and its correspondingly slow transport properties. Over this same initial plating time, it is believed that accelerator accumulates at a low, substantially uniform concentration over the entire plating surface, including the bottom and sidewalls of the feature. Because the accelerator diffuses into features more rapidly than the suppressor, the initial ratio of accelerator:suppressor within the feature (especially at the feature bottom) is relatively high. The relatively high initial accelerator:suppressor ratio within the feature promotes rapid plating from the bottom of the feature upwards and from the sidewalls inwards. Meanwhile, the initial plating rate in the field region is relatively low due to the lower ratio of accelerator:suppressor. Thus, in the initial plating stages, plating occurs relatively faster within the feature and relatively slower in the field region.

As plating continues, the feature fills with metal and the surface area within the feature is reduced. Because of the decreasing surface area and the accelerator substantially remaining on the surface, the local surface concentration of accelerator within the feature increases as plating continues. This increased accelerator concentration within the feature helps maintain the differential plating rate beneficial for bottom-up fill.

In the later stages of plating, particularly as overburden deposits, the accelerator may build up in certain regions (e.g., above filled features) undesirably, resulting in local faster-than-desired plating. Leveler may be used to counteract this effect. The surface concentration of leveler is greatest at exposed regions of a surface (i.e., not within recessed features) and where convection is greatest. It is believed that the leveler displaces accelerator, increases the local polarization and decreases the local plating rate at regions of the surface that would otherwise be plating at a rate greater than at other locations on the deposit. In other words, the leveler tends, at least in part, to reduce or remove the influence of an accelerating compound at the exposed regions of a surface, particularly at protruding structures. Without leveler, a feature may tend to overfill and produce a bump. Therefore, in the later stages of bottom-up fill plating, levelers are beneficial in producing a relatively flat deposit.

The use of suppressor, accelerator and leveler, in combination, allows a feature to be filled without voids from the bottom-up and from the sidewalls-inward, while producing a relatively flat deposited surface.

Using certain additives with the copper electroplating bath can increase the overall rate of copper plating while allowing bottom-up filling of recessed features, or otherwise improve copper plating. In some embodiments, because features in WLP devices are generally larger than those in damascene applications, and can be larger than about 2 µm, the rate of plating may also be higher than in damascene applications. As a result, for many WLP applications, the rate of plating can be greater than about 25% of the rate achieved at copper limiting current for electrolytic deposition of copper on the substrate. The copper limiting current is the current (or current density) at which any further increase in current does not increase the rate of copper deposition. The additional current beyond the limiting current drives electrochemical reactions other than copper electroplating. In some embodiments, electrolytic deposition of copper can proceed at a rate of at least about 1 µm per minute or more in a direction away from the substrate.

The process 400 continues at step 420 where the photoresist is removed from the substrate. The photoresist may be stripped or otherwise removed from the substrate using any techniques as known in the art. For example, the photoresist may be removed using a radio-frequency (RF) or microwave plasma resist stripper. Once the photoresist is removed, portions of the copper seed layer and any barrier layer may be exposed.

The process 400 continues at step 425, where the copper seed and any barrier layers are removed. In some embodiments, for example, the copper seed and/or the barrier layers may be removed by chemical etching.

The process 400 continues at step 430, where a solder structure contacts a pad of the copper containing structure. In some embodiments, the solder structure is a solder structure (e.g., a solder ball) that is mechanically dropped or otherwise placed to contact the pad of the copper containing structure. In some embodiments, the solder structure is formed by electrolytically plating solder material onto the pad of the copper containing structure.

Solder structures are used to electrically connect IC packaging structures to the interconnects of ICs. Pads on the copper containing structure are designated areas upon which soldering, wire bonding, flip chip mounting, or other similar connection can occur. In some embodiments, a solder structure can be affixed on top of the pad, which can be flat or elevated.

In certain embodiments, the solder structure may be a solder ball with a diameter between about 100 µm and about 500 µm. In other embodiments, the solder structure may be a solder layer plated electrolytically that can be between about 10 µm and about 50 µm in defined portions of the substrate.

The solder structure may include an elemental metal or metal alloy solder material that may be joined with another material to form a seal. In some embodiments, the solder structure may include tin or tin alloy solders. For example, the solder structure may include tin, tin-silver, tin-silver-copper, tin-copper, or tin-lead. While tin-lead may provide good quality "bumps" for packaging and are relatively easy to plate, lead may be less desirable than silver because of its toxicity.

In some embodiments, the solder structure may be formed by electrolytically plating solder material. Plating of the solder structure can be accomplished using any suitable electroplating technique known in the art. Plating of solder material, such as binary tin-silver or ternary tin-silver-copper, can be accomplished using an electroplating bath solution containing ions of two different metals as described in U.S. patent application Ser. No. 13/305,384, filed Nov. 28, 2011, the entirety of which is herein incorporated by reference.

The process 400 continues at step 435, where the solder structure is reflowed to form a solder joint with the copper containing structure. In other words, the solder structure is carefully melted or reflowed to create an electrically conductive interface attached to the pad of the copper containing structure. By reflowing the solder structure at about or above the melting temperature of the solder material, the solder joint or interface can be formed.

Figure 5A:
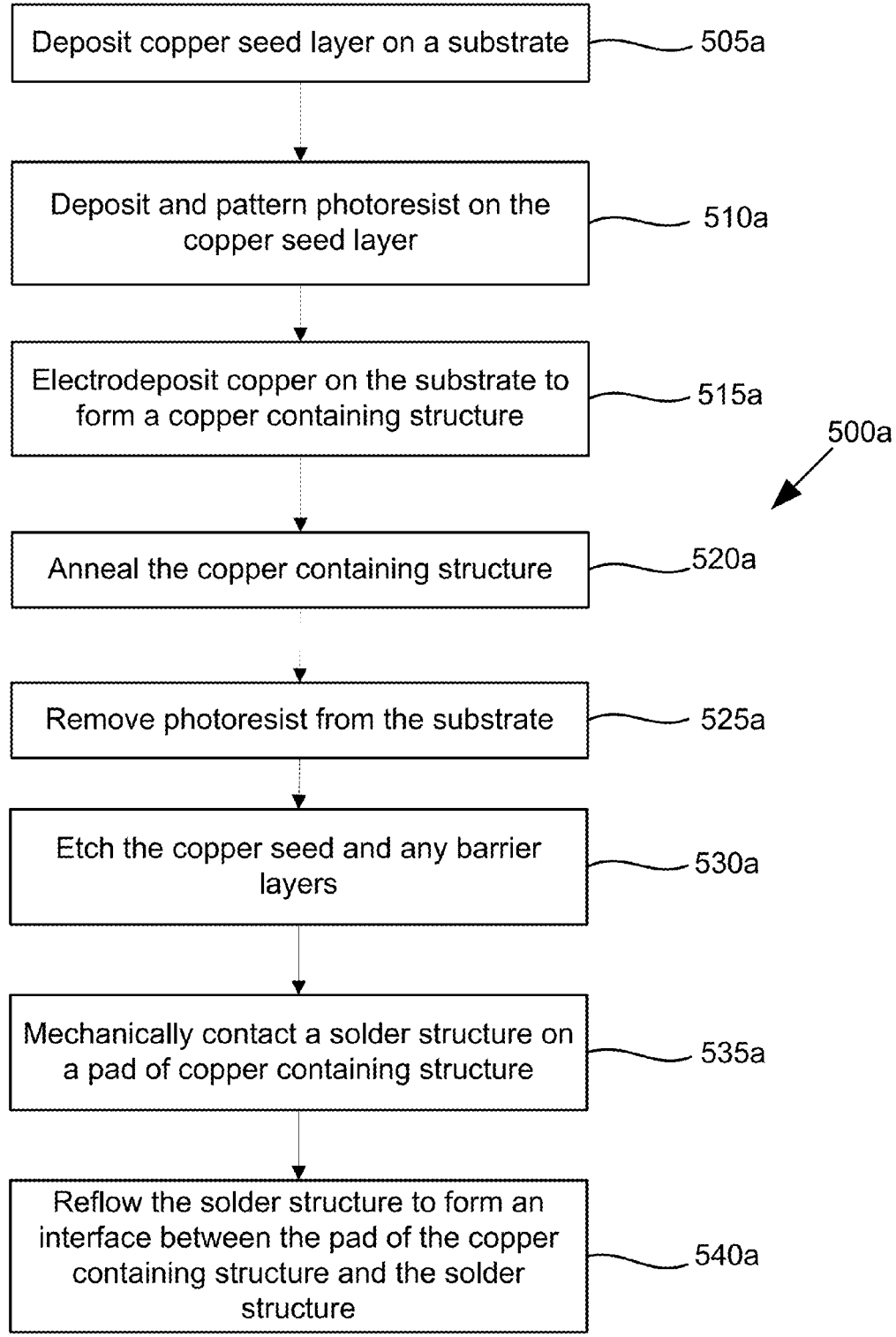
FIG. 5A shows an exemplary flowchart of a method of forming a solder interface with a pad of a copper containing structure thermally treated before removing photoresist.
Figure 5B:
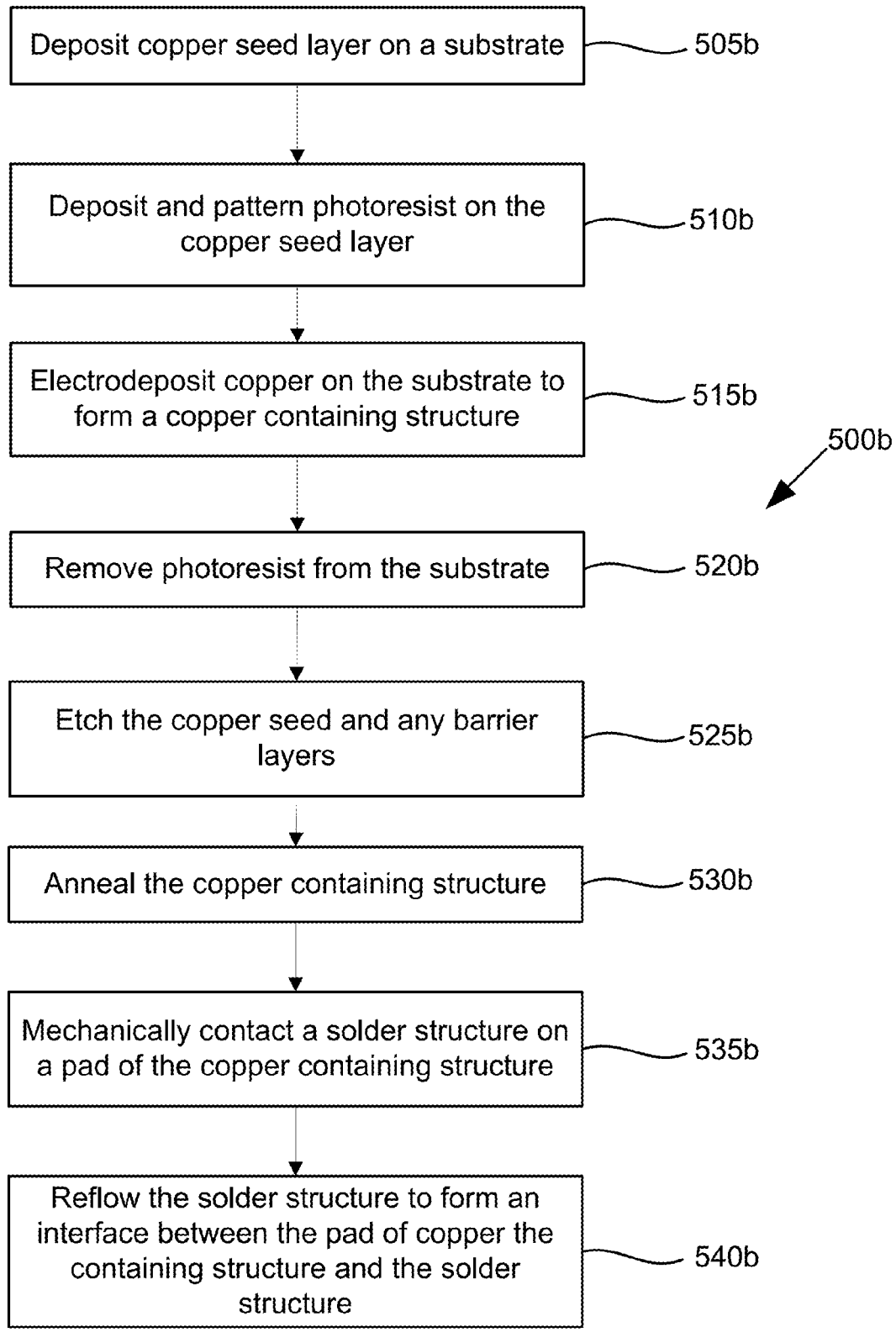
FIG. 5B shows an exemplary flowchart of a method of forming a solder interface with a pad of a copper containing structure thermally treated after removing photoresist.

FIG. 5A shows an exemplary flowchart of a method of forming a solder interface with a pad of a copper containing structure thermally treated before removing photoresist. FIG. 5B shows an exemplary flowchart of a method of forming a solder interface with a pad of a copper containing structure thermally treated after removing photoresist. In both FIGS. 5A and 5B, the processes 500a and 500b begin with steps 505a, 505b, and 510a, and steps 510b, 515a, and 515b, respectively, which are similar to steps 405, 410 and 415 in FIG. 4.

In FIG. 5A, the process 500a continues with step 520a where the electrodeposited copper is thermally treated. In step 520a, the copper containing structure is annealed before the photoresist is removed. Annealing the copper containing structure can move impurities and/or vacancies out to the surface of the copper containing structure.

In some embodiments, the copper containing structure is annealed at a temperature between about 100° C. and about 400° C. In certain embodiments, the copper containing structure is annealed at a temperature between about 100° C. and about 250° C. By reducing the annealing temperature, the remaining photoresist may avoid decomposition and remain intact. For example, many negative photoresists may be heated up to about a temperature of 200° C. before decomposition. An example of such a negative photoresist can include AZ® 15 NXT from AZ Electronic Materials (Branchburg, N.J.).

The annealing time may vary depending on the temperature of the annealing and the thickness of the copper containing structure. In some embodiments, the annealing time may be between about 30 seconds and about 180 seconds. In certain embodiments, for a copper containing structure having a thickness between about 1 µm and about 10 µm and for an annealing temperature between about 150° C. and about 200° C., the annealing time may be between about 90 seconds and about 150 seconds.

In some embodiments, the annealing may be performed under a reducing atmosphere. The reducing atmosphere can minimize oxidation of copper and other materials. The reducing atmosphere can include a forming gas (e.g., mixture of hydrogen and nitrogen), atomic hydrogen, or other chemical reducing agents. In addition, the annealing may be performed in an environment substantially free of oxygen. For example, the atmosphere can have a concentration of oxygen that is less than about 50 ppm.

Annealing the copper containing structure may be accomplished with many different techniques. For example, the copper containing structure may be heated by passing electric current through the copper containing structure (i.e., resistive heating). The copper containing structure may also be heated with ultraviolet (UV) light or infrared (IR) light. The copper containing structure may also be heated by plasma treatment either by an inert gas species (e.g., argon) or an activated gas species (e.g., hydrogen radical). The plasma treatment not only can anneal the copper containing structure, but can also remove surface contaminants that may have been introduced in an electrodeposition process or introduced from the photoresist. In some embodiments, the substrate may be heated constantly or periodically during the process cycles.

The copper containing structure that is electroplated with additives in solution may have more impurities and vacancies than a copper containing structure that is electroplated without additives or fewer additives, as suggested by the data provided earlier herein in FIGS. 3A-3C. The annealing step described earlier herein can remove impurities and vacancies in the copper containing structure by moving the impurities to and the vacancies to the surface. Such impurities and defects may be removed in subsequent processing steps, such as etching and planarization.

The migration of impurities and vacancies can be the result of the microstructural changes occurring in the copper containing structure during anneal. An elevated temperature anneal process accelerates the process of recovery, recrystallization, and grain growth in the copper containing structure. Thus, the impurities and vacancies may migrate in the direction of the thickness of the copper containing structure towards the surface as the copper containing structure recrystallizes and undergoes grain growth. The impurities and vacancies are localized to the surface of the copper containing structure for subsequent removal before reflowing the solder structure. Hence, the impurities and vacancies are annealed out to the surface before they can form voids in an interface between copper and the solder material. At least some of the impurities annealed to the surface of the copper containing structure may be removed by volatilization before reflow.

The process 500a continues with step 525a, where the photoresist is removed. Step 525a is similar to the step 420 in FIG. 4.

The process continues with step 530a, where the copper seed and any barrier layers are etched from the substrate. In step 530a, the etch can serve multiple functions. The etch can selectively remove portions of the copper seed layer and barrier layer, and can also remove impurities that migrated to the surface of the copper containing structure.

The process 500a continues with step 535a, where a solder structure mechanically contacts a pad of the copper containing structure. In some embodiments, the solder structure can be a solder ball mechanically positioned and dropped to contact the pad of the copper containing structure.

The process 500a continues with step 540a, where the solder structure is reflowed to form the interface between the pad of the copper containing structure and the solder structure. Because of the annealing treatment applied to the copper containing structure earlier to move out impurities and vacancies, the resulting interface between the copper containing structure and the solder structure will have increased resistance to interfacial voiding.

FIG. 5B is similar to FIG. 5A except for the difference that the removal of the photoresist and etching the copper seed layer and any barrier layer occurs before annealing the copper containing structure. Therefore, after electrodepositing copper to form the copper containing structure on the substrate in step 515b, the process 500b proceeds in step 520b with removal of the photoresist, followed by step 525b with etching the copper seed and any barrier layers, and then followed by step 530b with annealing the copper containing structure. Annealing the copper containing structure may cause impurities to migrate to the surface of the copper containing structure and volatilized. Without the photoresist, the copper containing structure may be annealed at elevated temperatures greater than the decomposition temperature of the photoresist, such as between about 100° C. and about 400° C. Other than that, the annealing conditions in step 530b may be similar to the annealing conditions described in step 520a in FIG. 5A.

The process 500b continues with step 535b and 540b, where a solder structure mechanically contacts a pad of the copper containing structure and is reflowed to form an interface between the pad of the copper containing structure and the solder structure. Steps 535b and 540b in FIG. 5B are similar to steps 535a and 540a in FIG. 5A.

In various embodiments, the heat treatment or anneal is conducted prior to contacting copper pads with solder. However, in some cases, the heat treatment is performed after contacting the solder with the copper pad but prior to forming an interface with the solder. The solder may be placed atop the copper pad prior to forming an interface. The heat treatment may be performed at a low enough temperature that the solder does not reflow but impurities are removed, such as by volatilization. Then, after the impurities are removed, the temperature of the heat treatment is increased to cause the solder to flow.

Figure 6:
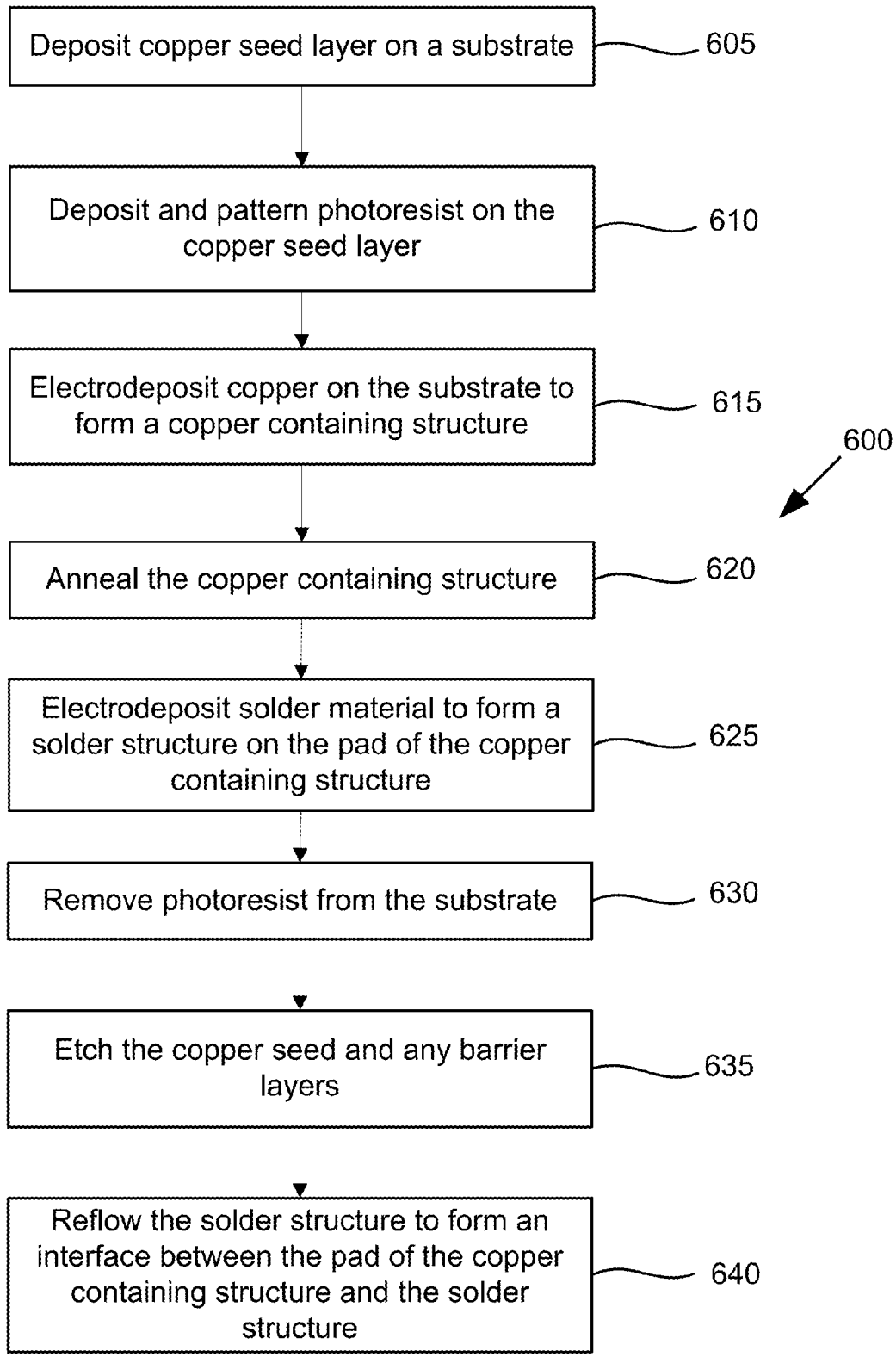
FIG. 6 shows an exemplary flowchart of a method of forming a plated solder interface with a thermally treated pad of a copper containing structure.

In some embodiments, rather than mechanically contacting a solder structure over a pad of the copper containing structure, the solder structure may be formed by electrolytic plating of solder material over the pad of the copper containing structure. FIG. 6 shows an exemplary flowchart of a method of forming a plated solder interface with a thermally treated pad of a copper containing structure.

The process 600 begins with steps 605, 610, 615, and 620, which are similar to steps 505a, 510a, 515a, and 520a in FIG. 5A. Annealing takes place with the photoresist intact. After annealing the copper containing structure, the process 600 continues with step 625, where solder material is electrodeposited to form a solder structure on a pad of the copper containing structure. The solder material may include tin or a tin alloy that is electroplated according to processes described earlier herein.

The process 600 proceeds with steps 630, 635, and 640, which are similar to steps 525a, 530a, and 540a in FIG. 5A. However, unlike the process 500a in FIG. 5A, the process 600 does not necessarily include a step of mechanically contacting the solder structure on the pad of the copper containing structure since the plated solder structure is already in contact with the pad of the copper containing structure.

In some embodiments, the steps 615, 620, and 625 can be performed within the same electroplating tool. In other words, the steps of electrodepositing copper, annealing, and electrodepositing solder material can all occur using the same tool or apparatus. In some embodiments, the steps 615, 620, 625, 630, and 635 can be performed within the same electroplating tool. In other words, the steps of electrodepositing copper, annealing, electrodepositing solder material, removing photoresist, and etching copper seed and barrier layers can all occur using the same tool or apparatus.

Apparatus

Figure 7:
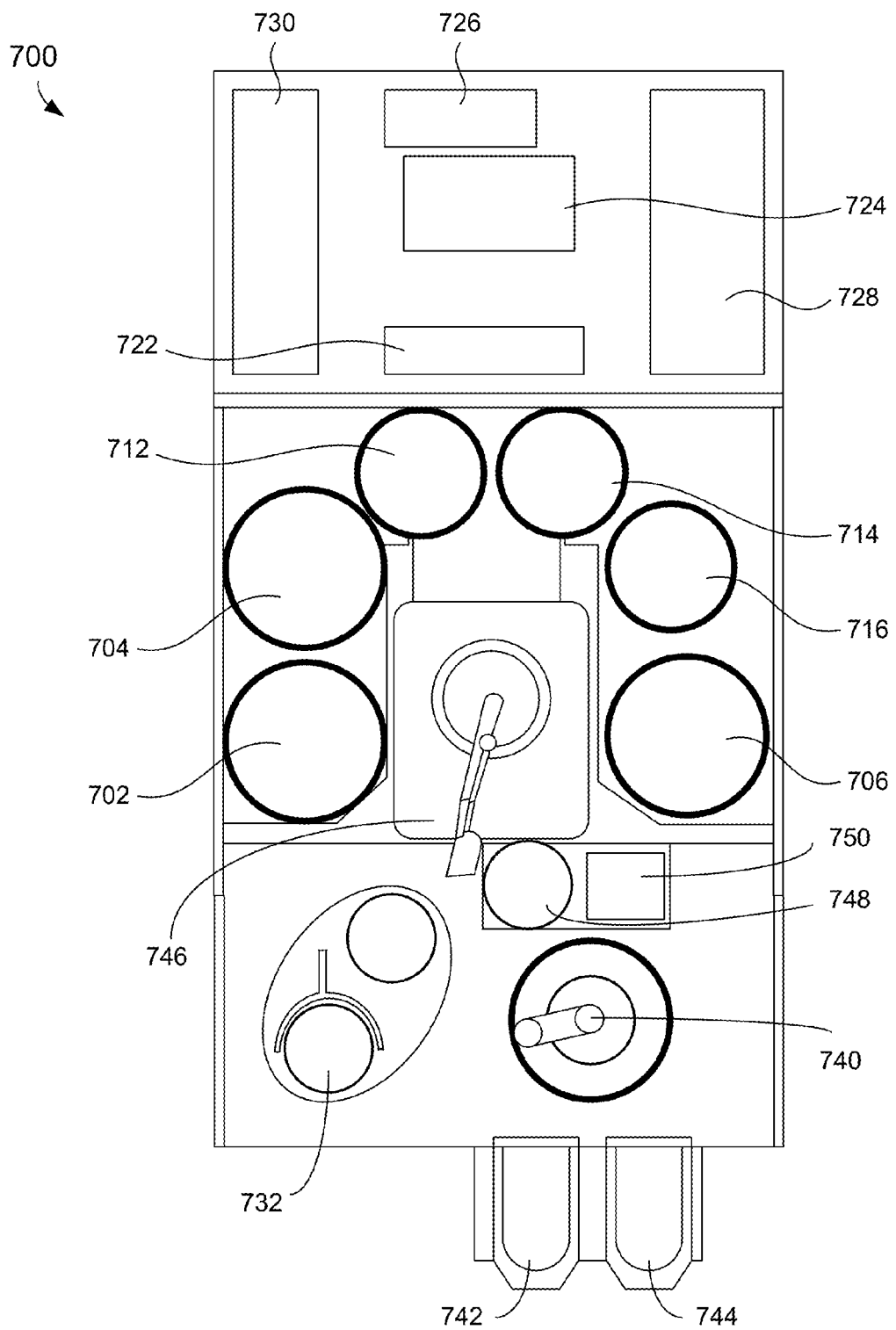
FIG. 7 shows an example of a top view schematic of an electrodeposition apparatus.

Some of the electrodeposition and annealing treatment methods disclosed herein can be described in reference to, and may be employed in the context of, various integrated tool apparatuses. Electrodeposition, annealing, and other methods disclosed herein can be performed in components that form a larger electrodeposition apparatus. FIG. 7 shows a schematic of a top view of an electrodeposition apparatus. The electrodeposition apparatus 700 can include three separate electroplating modules 702, 704, and 706. The electrodeposition apparatus 700 can also include three separate modules 712, 714, and 716 configured for various process operations. For example, in some embodiments, modules 712 and 716 may be spin rinse drying (SRD) modules and module 714 may be an annealing station. In other embodiments, the modules 712, 714, and 716 may be post-electrofill modules (PEMs), each configured to perform a function, such as edge bevel removal, backside etching, and acid cleaning of substrates after they have been processed by one of the electroplating modules 702, 704, and 706.

The electrodeposition apparatus 700 includes a central electrodeposition chamber 724. The central electrodeposition chamber 724 is a chamber that holds the chemical solution used as the electroplating solution in the electroplating modules 702, 704, and 706. The electrodeposition apparatus 700 also includes a dosing system 726 that may store and deliver additives for the electroplating solution. A chemical dilution module 722 may store and mix chemicals to be used as an etchant. A filtration and pumping unit 328 may filter the electroplating solution for the central electrodeposition chamber 724 and pump it to the electroplating modules.

In some embodiments, an annealing station 732 may be used to anneal substrates as a pretreatment. In some embodiments, the annealing station 732 may also be used for annealing copper containing structures before reflow, as described earlier herein. The annealing station 732 may include a number of stacked annealing devices, e.g., five stacked annealing devices. The annealing devices may be arranged in the annealing station 732 one on top of another, in separate stacks, or in other multiple device configurations.

A system controller 730 provides electronic and interface controls required to operate the electrodeposition apparatus 700. The system controller 730 (which may include one or more physical or logical controllers) controls some or all of the properties of the electroplating apparatus 700. The system controller 730 typically includes one or more memory devices and one or more processors. The processor may include a central processing unit (CPU) or computer, analog and/or digital input/output connections, stepper motor controller boards, and other like components. Instructions for implementing appropriate control operations as described herein may be executed on the processor. These instructions may be stored on the memory devices associated with the system controller 730 or they may be provided over a network. In certain embodiments, the system controller 730 executes system control software.

The system control software in the electrodeposition apparatus 700 may include instructions for controlling the timing, mixture of electrolyte components, inlet pressure, plating cell pressure, plating cell temperature, substrate temperature, current and potential applied to the substrate and any other electrodes, substrate position, substrate rotation, and other parameters of a particular process performed by the electrodeposition apparatus 700. Specifically, the system control software may also include instructions for an annealing station that controls the timing, temperature, mode of heating, mixture of gases in atmosphere, and other parameters of the annealing station. System control software may be configured in any suitable way. For example, various process tool component sub-routines or control objects may be written to control operation of the process tool components necessary to carry out various process tool processes. System control software may be coded in any suitable computer readable programming language.

In some embodiments, system control software includes input/output control (IOC) sequencing instructions for controlling the various parameters described above. For example, each phase of an electroplating process may include one or more instructions for execution by the system controller 730. The instructions for setting process conditions for an immersion process phase may be included in a corresponding immersion recipe phase. In some embodiments, the electroplating recipe phases may be sequentially arranged, so that all instructions for an electroplating process phase are executed concurrently with that process phase.

Other computer software and/or programs may be employed in some embodiments. Examples of programs or sections of programs for this purpose include a substrate positioning program, an electrolyte composition control program, a pressure control program, a heater control program, and a potential/current power supply control program.

In some embodiments, there may be a user interface associated with the system controller 730. The user interface may include a display screen, graphical software displays of the apparatus and/or process conditions, and user input devices such as pointing devices, keyboards, touch screens, microphones, etc.

In some embodiments, parameters adjusted by the system controller 730 may relate to process conditions. Non-limiting examples include temperature, duration, composition of gases in the atmosphere, etc. These parameters may be provided to the user in the form of a recipe, which may be entered utilizing the user interface.

Signals for monitoring the process may be provided by analog and/or digital input connections of the system controller 730 from various process tool sensors. The signals for controlling the process may be output on the analog and digital output connections of the process tool. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

In some embodiments, the system controller 730 includes instructions for performing a variety of other electroplating related processes and steps. Some of the electroplating related processes can be part of, for example, pretreatment processes, pre-electrodeposition processes, post-electrodeposition processes, etc. The instructions can include instructions for removing copper seed and barrier layers, such as chemical etching. For example, the instructions can specify the etching conditions and type of etchant. The system controller 730 may also include instructions for removing photoresist, specifying conditions for photoresist stripping, for example. The system controller 730 may further include instructions for sequential plating of copper and solder material. In some embodiments, the system controller 730 may specify instructions for plating copper on a copper seed layer to form a copper containing structure in a module, and the system controller 730 may also specify instructions for plating solder material to form a solder structure in the same or another module.

In one embodiment, the instructions can include electrodepositing a copper containing structure on a substrate, annealing the copper containing structure, and forming an interface between a pad of the copper containing structure and a solder structure after annealing the copper containing structure. The copper containing structure is configured to deliver current between one or more ports and one or more solder structures in the IC package. The interface between the pad and the solder structure has improved resistance to interfacial voiding at the interface.

In some embodiments, electrodepositing the copper containing structure is performed at a rate that is at least 25% of the limiting current for electrodepositing copper. In some embodiments, annealing the copper containing structure occurs at a temperature between about 100° C. and about 250° C. The copper containing structure may contain only copper or copper alloy. In some embodiments, the system controller 730 includes instructions for mechanically placing the solder structure on the pad after annealing the copper containing structure. The system controller 730 may also include instructions for electrodepositing the solder structure on the pad after annealing the copper containing structure. The system controller 730 may also include instructions for removing photoresist from the substrate used for patterning the copper containing structure after annealing the copper containing structure. In some embodiments, the system controller 730 may include instructions for removing photoresist from the substrate used for patterning the copper containing structure before annealing the copper containing structure.

In some embodiments, instructions for electrodepositing the copper containing structure include instructions for using an electroplating solution containing additives. The additives can include at least one of an accelerator, suppressor, or leveler. In some embodiments, instructions for electrodepositing the copper containing structure include instructions for electrodepositing the copper containing structure at a rate that is greater than about 1 μm per minute in a direction away from the substrate. In some embodiments, instructions for annealing the copper containing structure include instructions for annealing the copper containing structure in a reducing gas atmosphere.

A hand-off tool 740 may select a substrate from a substrate cassette such as the cassette 742 or the cassette 744. The cassettes 742 or 744 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 740 may hold the substrate using a vacuum attachment or some other attaching mechanism.

The hand-off tool 740 may interface with the annealing station 732, the cassettes 742 or 744, a transfer station 750, or an aligner 748. From the transfer station 750, a hand-off tool 746 may gain access to the substrate. The transfer station 750 may be a slot or a position from and to which hand-off tools 740 and 746 may pass substrates without going through the aligner 748. In some embodiments, however, to ensure that a substrate is properly aligned on the hand-off tool 746 for precision delivery to an electroplating module, the hand-off tool 746 may align the substrate with an aligner 748. The hand-off tool 746 may also deliver a substrate to one of the electroplating modules 702, 704, or 706 or to one of the three separate modules 712, 714, and 716 configured for various process operations.

An example of a process operation according to the methods described above may proceed as follows: (1) electrodeposit copper onto a substrate to form a copper containing structure in the electroplating module 704; (2) rinse and dry the substrate in SRD in module 712; and, (3) anneal the copper containing structure in module 714.

In some embodiments, the module 714 may anneal the substrate with a hot plate resistive electrical heating of the copper containing structure itself. In some embodiments, the module 714 may include an ultraviolet (UV) light source or an infrared (IR) light source to anneal the wafer. In some embodiments, the electrodeposition apparatus 700 may include a device to heat the substrate constantly during plating operations. This might be done through the substrate backside.

An apparatus configured to allow efficient cycling of substrates through sequential plating, rinsing, drying, and annealing process operations may be useful for implementations for use in a manufacturing environment. To accomplish this, the module 712 can be configured as a spin rinse dryer and an annealing chamber. With such a module 712, the substrate would only need to be transported between the electroplating module 704 and the module 712 for the copper plating and annealing operations. Further, in some embodiments, the electrodeposition apparatus 700 may keep the substrate in a vacuum environment, an inert gas atmosphere, or a reducing gas atmosphere to aid in avoiding contamination of the substrate.

Figure 8:
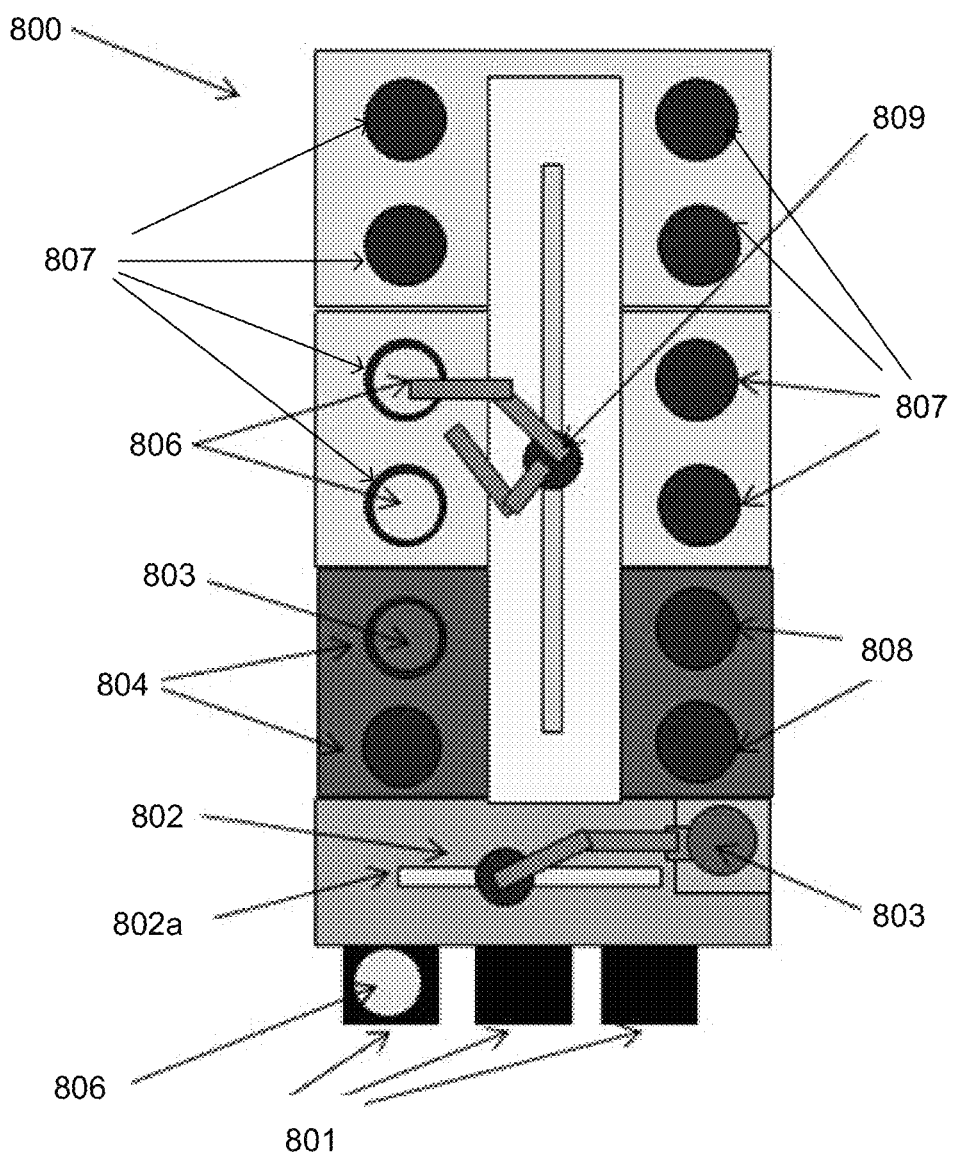
FIG. 8 shows an example of a top view schematic of an automated electroplating apparatus having a set of electroplating cells in a duet configuration.

An alternative embodiment of an electrodeposition apparatus 800 is schematically illustrated in FIG. 8. In this embodiment, the electrodeposition apparatus 800 has a set of electroplating cells 807, each containing an electroplating bath, in a paired or multiple "duet" configuration. In addition to electroplating per se, the electrodeposition apparatus 800 may perform a variety of other electroplating related processes and sub-steps, such as spin-rinsing, spin-drying, metal and silicon wet etching, electroless deposition, pre-wetting and pre-chemical treating, reducing, annealing, photoresist stripping, and surface pre-activation, for example. The electrodeposition apparatus 800 is shown schematically looking top down in FIG. 8, and only a single level or "floor" is revealed in the figure, but it is to be readily understood by one having ordinary skill in the art that such an apparatus, e.g. the Novellus Sabre™ 3D tool, can have two or more levels "stacked" on top of each other, each potentially having identical or different types of processing stations.

Referring once again to FIG. 8, the substrates 806 that are to be electroplated are generally fed to the electrodeposition apparatus 800 through a front end loading FOUP 801 and, in this example, are brought from the FOUP to the main substrate processing area of the electrodeposition apparatus 800 via a front-end robot 802 that can retract and move a substrate 806 driven by a spindle 803 in multiple dimensions from one station to another of the accessible stations—two front-end accessible stations 804 and also two front-end accessible stations 808 are shown in this example. The front-end accessible stations 804 and 808 may include, for example, pretreatment stations, annealing stations, and spin rinse drying (SRD) stations. Lateral movement from side-to-side of the front-end robot 802 is accomplished utilizing robot track 802a. Each of the substrates 806 may be held by a cup/cone assembly (not shown) driven by a spindle 803 connected to a motor (not shown), and the motor may be attached to a mounting bracket 809. Also shown in this example are the four "duets" of electroplating cells 807, for a total of eight electroplating cells 807. The electroplating cells 807 may be used for electroplating copper for the copper containing structure and electroplating solder material for the solder structure. A system controller (not shown) may be coupled to the electrodeposition apparatus 800 to control some or all of the properties of the electrodeposition apparatus 800. The system controller may also be programmed or otherwise configured to execute instructions according to processes described earlier herein.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

OTHER EMBODIMENTS

Although the foregoing has been described in some detail for purposes of clarity and understanding, it will be apparent that certain changes and modifications may be practiced within the scope of the appended claims. It should be noted that there are many alternative ways of implementing the processes, systems, and apparatus described. Accordingly, the described embodiments are to be considered as illustrative and not restrictive.

What is claimed is:

1. A method of treating a copper containing structure in an integrated circuit package, comprising: electrodepositing copper on a substrate to form a copper containing structure, wherein the copper containing structure includes at least 90 weight percent of copper, wherein the copper containing structure is configured to deliver current between one or more ports and one or more solder structures in the integrated circuit package; annealing the copper containing structure prior to forming an interface with the copper containing structure and one of the solder structures; and after annealing the copper containing structure, forming the interface between the copper containing structure and one of the solder structures, wherein the interface between the copper containing structure and the solder structure has improved resistance to interfacial voiding at the interface.

2. The method of claim 1, wherein forming the interface comprises:
mechanically contacting the solder structure on the copper containing structure after annealing the copper containing structure; and
reflowing the solder structure.

3. The method of claim 1, wherein forming the interface comprises electrodepositing a solder material to form the solder structure on the copper containing structure after annealing the copper containing structure.

4. The method of claim 3, wherein electrodepositing the copper and electrodepositing the solder material occur in the same electrodepositing tool.

5. The method of claim wherein the copper containing structure comprises only copper or copper alloy.

6. The method of claim 1, wherein copper containing structure is part of a redistribution layer in the integrated circuit package.

7. The method of claim 1, wherein electrodepositing the copper on the substrate to form the copper containing structure comprises using an electroplating solution containing additives.

8. The method of claim 7, wherein the additives comprise at least one of an accelerator, suppressor, or leveler.

9. The method of claim 1, wherein the copper containing structure has a thickness greater than about 1 µm.

10. The method of claim 1, wherein the one or more solder structures comprises tin.

11. The method of claim 10, wherein the interface comprises an intermetallic compound, the intermetallic compound comprising copper and tin.

12. The method of claim 1, wherein electrodepositing the copper on the substrate to form the copper containing structure is performed at a rate that is at least 25% of the limiting current for electrodepositing copper.

13. The method of claim 12, wherein the rate of electrodepositing the copper on the substrate to form the copper containing structure is greater than about 1 µm per minute in a direction away from the substrate.

14. The method of claim 1, wherein the copper containing structure and the solder structure is substantially free of any nickel, cobalt, and gold.

15. The method of claim 1, wherein annealing the copper containing structure comprises annealing at a temperature between about 100° C. and about 400° C.

16. The method of claim 1, wherein annealing the copper containing structure comprises annealing for a duration between about 30 seconds and about 180 seconds.

17. The method claim 1, wherein annealing the copper containing structure is performed in a reducing gas atmosphere.

18. The method of claim 1, further comprising removing a photoresist from the substrate used for patterning the copper containing structure before annealing the copper containing structure.

19. The method of claim 1, further comprising removing a photoresist from the substrate used for patterning the copper containing structure after annealing the copper containing structure.

* * * * *